(12) United States Patent
Chen

(10) Patent No.: US 7,919,413 B2
(45) Date of Patent: Apr. 5, 2011

(54) METHODS FOR FORMING PATTERNS

(75) Inventor: Frederick T Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 893 days.

(21) Appl. No.: 11/834,579

(22) Filed: Aug. 6, 2007

(65) Prior Publication Data
US 2009/0042391 A1   Feb. 12, 2009

(51) Int. Cl.
*H01L 21/311* (2006.01)

(52) U.S. Cl. ........ 438/692; 438/689; 438/703; 438/386; 257/E21.249

(58) Field of Classification Search .......... 438/692, 438/703, 689, 386; 257/E21.249
See application file for complete search history.

(56) References Cited

U.S. PATENT DOCUMENTS

| 5,538,592 A | 7/1996 | Chen et al. |
| 5,795,830 A | 8/1998 | Cronin et al. |
| 5,918,132 A | 6/1999 | Qian et al. |
| 6,300,221 B1 | 10/2001 | Roverds et al. |
| 6,335,257 B1 * | 1/2002 | Tseng ............ 438/397 |
| 7,335,580 B1 | 2/2008 | Buerger, Jr. et al. |
| 2006/0024621 A1 | 2/2006 | Nolscher et al. |
| 2006/0105537 A1 * | 5/2006 | Nam et al. ............ 438/396 |
| 2006/0240361 A1 | 10/2006 | Lee et al. |
| 2007/0148968 A1 | 6/2007 | Kwon et al. |

OTHER PUBLICATIONS

Choi et al, "Fabrication of Sub-10-nm Silicon Nanowire Arrays by Size Reduction Lithography", J. Phys. Chem. Bn 2003, 107, pp. 3340-3343, Mar. 20, 2003, American Chemical Society, US.

* cited by examiner

*Primary Examiner* — Nadine G Norton
*Assistant Examiner* — Mahmoud Dahimene

(57) ABSTRACT

A method for forming patterns comprises providing a substrate. A set of seed features is formed over the substrate. At least one bi-layer comprising a first layer followed by a second layer is formed on the set of seed features. The first layer and the second layer above the set of seed features are removed. The first layer and the second layer are anisotropically etched successively at least one time to form an opening next to the set of seed features.

16 Claims, 17 Drawing Sheets

METHODS FOR FORMING PATTERNS

BACKGROUND OF THE INVENTION

1. Field of the Invention

The present invention relates to semiconductor fabrications, and in particular relates to methods for forming patterns.

2. Description of the Related Art

Lithography beyond the 45 nm node faces numerous challenges. The challenges are associated with the use of photoresists to define sub-40 nm features, including line-edge roughness, shot noise, acid diffusion blur, and resist collapse. The use of ionizing radiation such as extreme ultraviolet radiation, X-rays, ion beams or electron beams pose additional concerns such as surface charging and contamination.

In light of such difficulties, double patterning has recently emerged as a way to proceed to the 32 nm half-pitch node. In such an approach, two critical lithographic exposures are required. The second exposure must be critically aligned to insert new features between previously exposed features. Thus, this adds a potential source of yield loss, and adds an extra cost for the second photolithographic step.

Other methods for producing fine pitch patterns have been disclosed. A form of double patterning which does not require a second critical exposure uses sidewall spacer formation to effectively achieve feature doubling. This approach is described for example in "Fabrication of Sub-10 nm Silicon Nanowire Arrays by Size Reduction Lithography" by Choi et. al. (J. Phys. Chem B. 107, 3340-3343 (2003)). However, the method is potentially limited by lack of selectivity between the spacer material and the underlying substrate, but more significantly cannot prevent the erosion at the top of the spacer during etching. This results in a tapered tip profile which could affect dimensional control during deposition and etching.

In the U.S. Pat. No. 5,795,830, "Reducing pitch with continuously adjustable lines and space dimensions", feature spacing is reduced by oxidizing a portion of pre-existing polysilicon lines, then depositing conformal oxide. Removing the polysilicon after etching back the conformal oxide cover results in a shrink of the space in-between features. This however, does not allow generation of regular arrays of features, and the tapered profile of the etched back oxide is still an issue.

In the U.S. Pat. No. 5,918,132, "Method for narrow space formation and self-aligned channel implant", spacer material and hard mask material are deposited on a previously defined hard mask, and planarization is used to produce a narrower spacer separating the first and second hard mask materials. The spacer is then etched away, leaving a narrow groove separating the first and second materials. This method is applied only to produce a single isolated narrow groove, and not designed to produce an array of dense features.

There is therefore a need for new methods of forming ultrafine patterns.

BRIEF SUMMARY OF THE INVENTION

A detailed description is given in the following embodiments with reference to the accompanying drawings.

A method for forming patterns according an embodiment of the invention comprises providing a substrate. A set of seed features is formed over the substrate. At least one bi-layer comprising a first layer followed by a second layer is formed on the set of seed features. The first layer and the second layer above the set of seed features are removed. The first layer and the second layer are anisotropically etched successively at least one time to form an opening next to the set of seed features.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
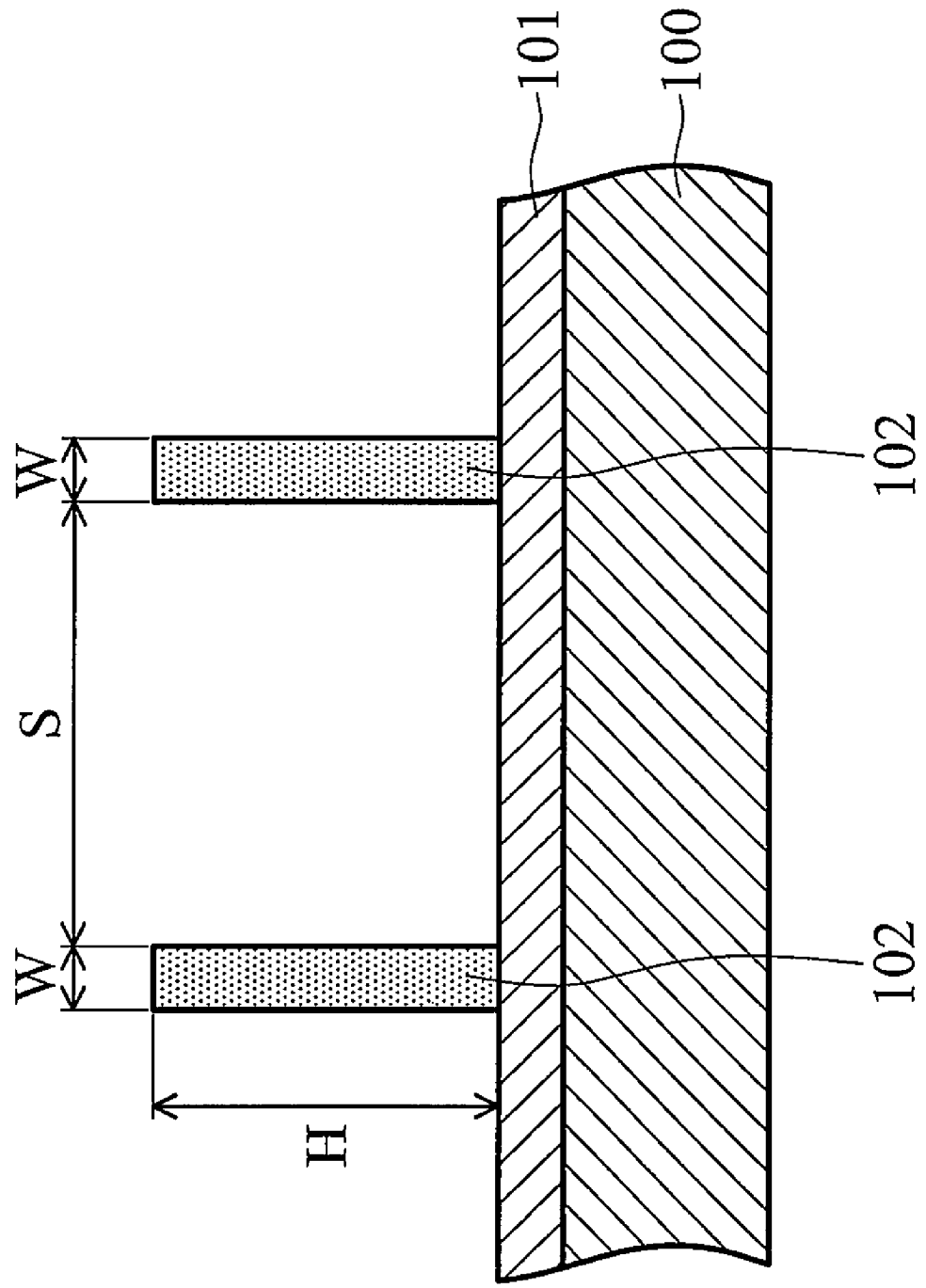
FIGS. 1 to 8 are schematic views showing a method for forming patterns according to an embodiment of the invention.

FIGS. 1 to 8 are schematic views showing a method for forming patterns according to an embodiment of the invention. Referring to FIG. 1, a substrate 100 having a mask layer 101 formed thereon is first provided. The substrate 100 may comprise semiconductor material such as silicon, germanium or gallium arsenic. For example, the substrate 100 may be a silicon wafer. The mask layer 101 may comprise material such as amorphous silicon, oxynitride or titanium nitride. For example, the mask layer 101 may be a layer of amorphous silicon. There may be layers or some devices such as a transistor or a metal plug formed in or between the substrate 100 and the mask layer 101. However, these devices or layers are omitted in the figures for the purpose of simplicity. A set of seed features 102 is then formed on the mask layer 101. The seed features 102 may comprise nitride such as silicon nitride. For example, a layer of silicon nitride may be deposited on the mask layer 101, and then the layer of silicon nitride is patterned by lithography to form the seed features 102 as FIG. 1 shows. Spacing between two adjacent seed features 102 shown in FIG. 1 is "S". The width of the feature is "W".

Figure 2:
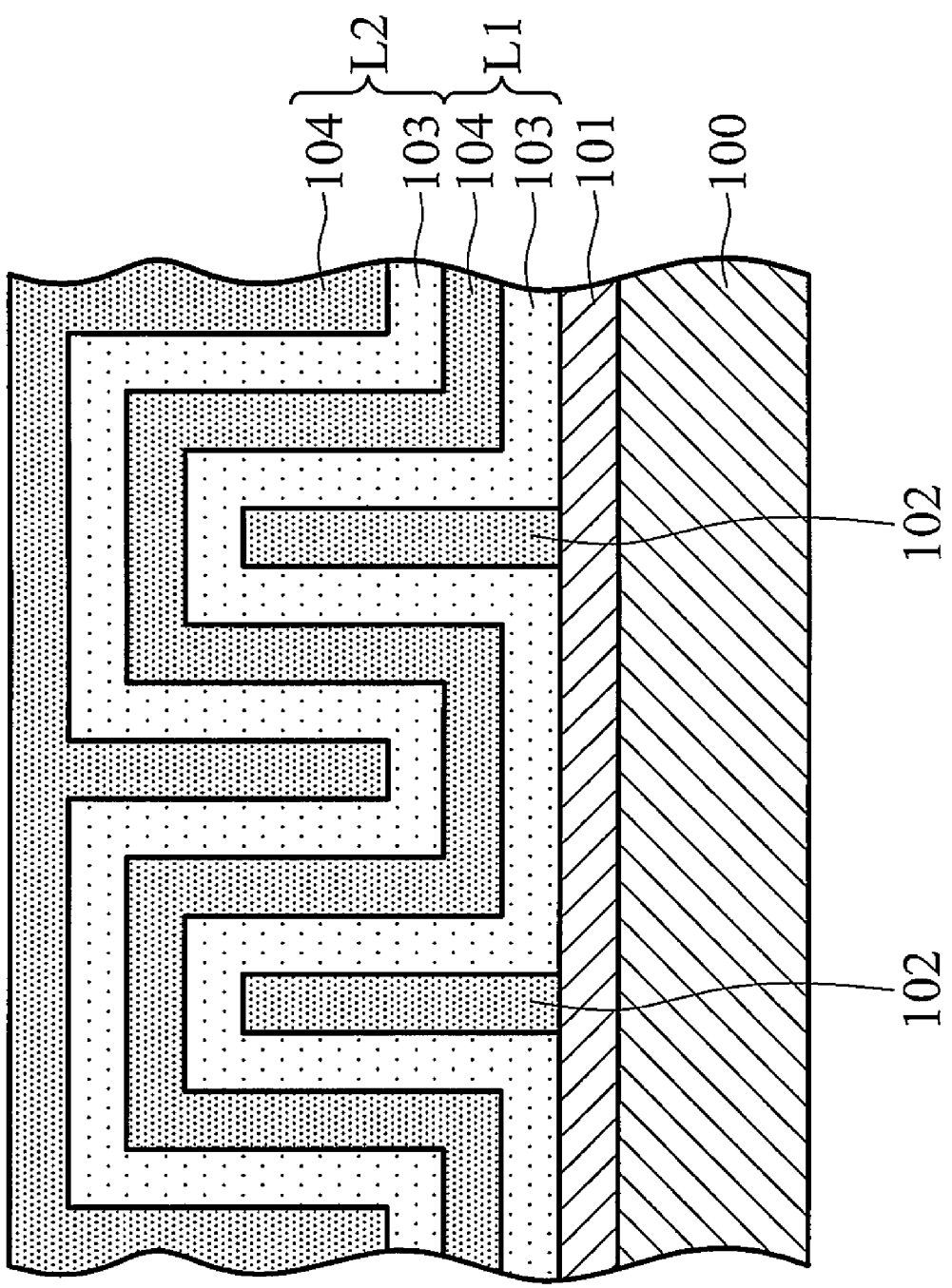

A sequence of alternating layers is formed on the seed features 102. For example, 2 bi-layers L1 and L2 may be deposited on the seed features 102 as FIG. 2 shows. Each bi-layer may comprise a first layer 103 followed by a second layer 104. Forming the bi-layer L1 on the seed features 102 may comprise conformally depositing a layer of first material 103 over the seed features 102 and then conformally depositing a layer of second material 104 over the layer of first material 103. All the first layers 103 are of the same material, and may comprise silicon dioxide, silicon nitride, silicon oxynitride or amorphous silicon. All the second layers 104 are of the same material, and may comprise silicon dioxide, silicon nitride, silicon oxynitride or amorphous silicon. The material of the first layer 103 should be different from that of the second layer 104, in consideration of the selective etching in the following processes. For example, the first layer 103 may be silicon oxide and the second layer 104 may be silicon nitride. In one embodiment, a blanket film (not shown) may be formed on the upper-most bi-layer to create a flat top surface on the resulting structure if any recess exists above the upper-most bi-layer after forming the sequence of the alternating layers on the seed features 102. The blanket film may be the same material as either the first or second layer. In one embodiment, depositions of the first layer 103 and the second layer 104 of the bi-layer L1 and L2 are conformal and are well-established processes such as plasma-enhanced chemical vapor deposition (PECVD) or atomic-layer deposition (ALD). In another embodiment, thermal oxidation may be used to form the bi-layer. Deposition of the sequence of the alternating layers may take place in one chamber.

Figure 3:
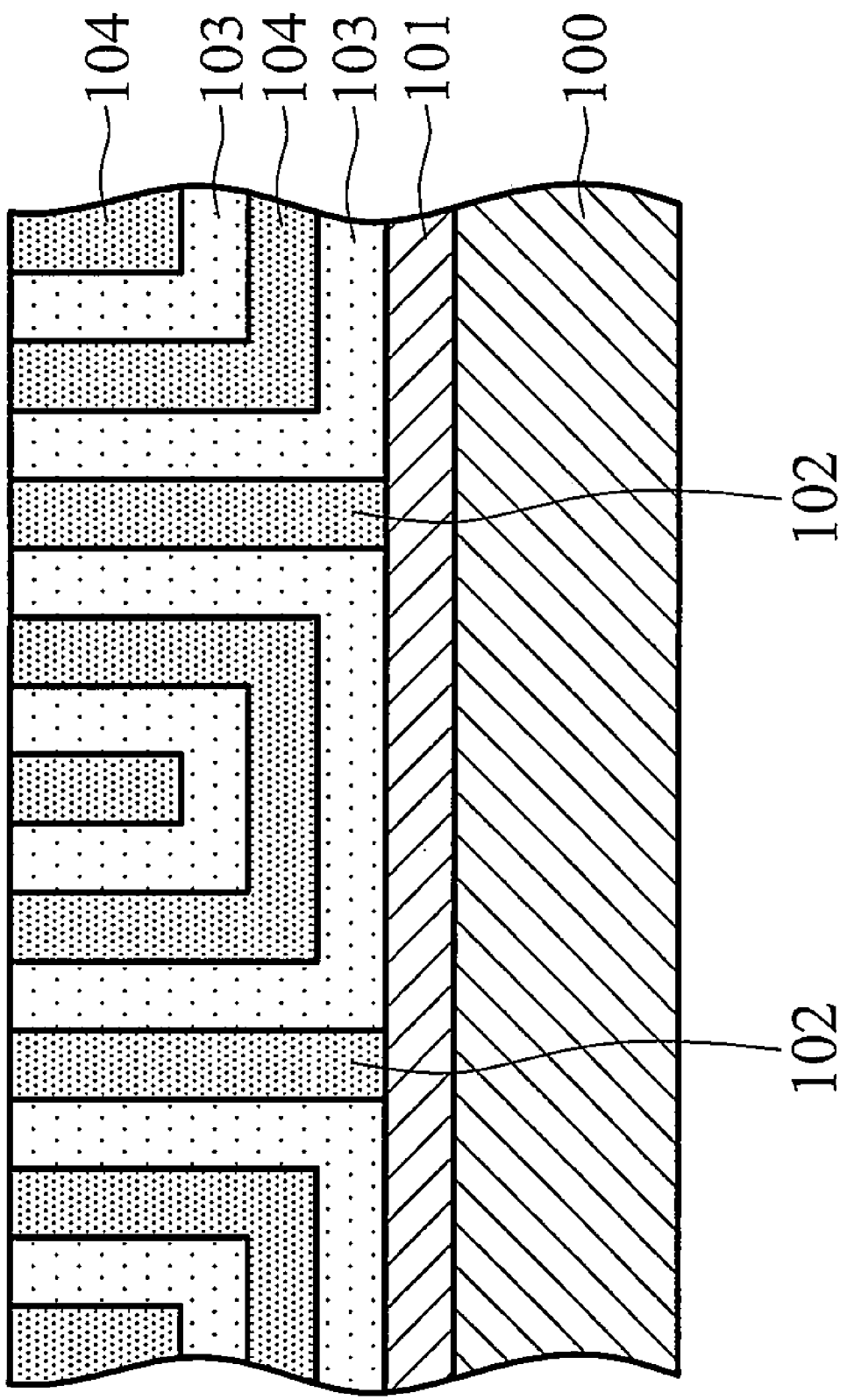

Referring to FIG. 3, a planarization step is performed to remove the first layer 103 and the second layer 104 above the seed features 102 to reveal top surface of the seed features 102. The planarization step may be chemical-mechanical planarization (CMP) and/or etch-back. In one embodiment, the planarization step removes the first layer 103 and the second layer 104 at equal rates, and exposes the first layer 103 and the second layer 104 on the leveled surface.

Figure 4:
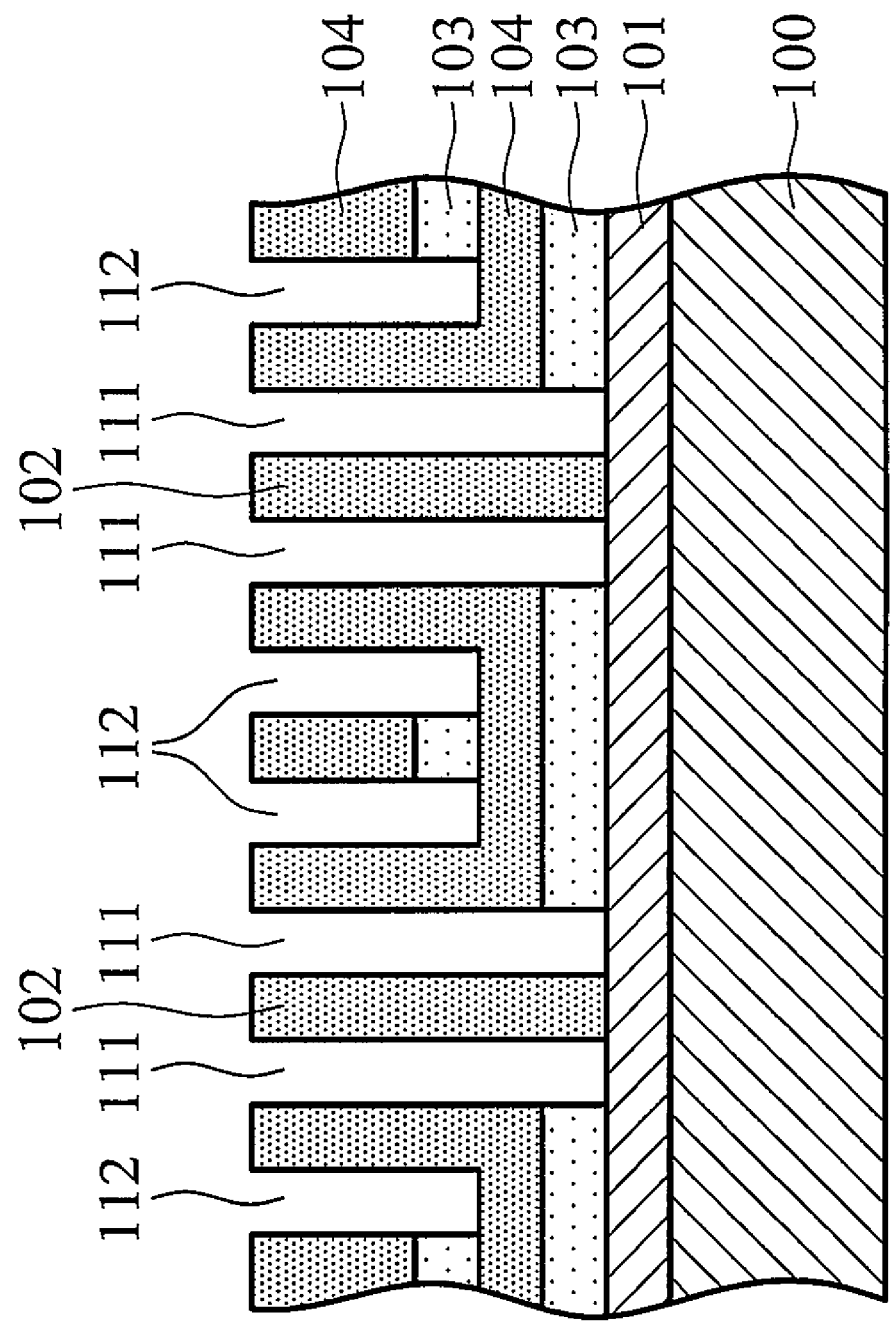

Referring to FIG. 4, a first etching step is next performed to anisotropically etch the first layer 103. This first etch step is selective to the mask layer 101, seed features 102 and the second layer 104, thus the first layer 103 is selectively and anisotropically etched without substantially attacking the second layer 104 and the seed features 102. After the first layer 103 is etched, first openings 111 are opened up next to the seed feature 102 to expose the underlying mask layer 101 while second openings 112 are opened to reveal the second layer 104 at the bottom of second openings 112.

Figure 5:
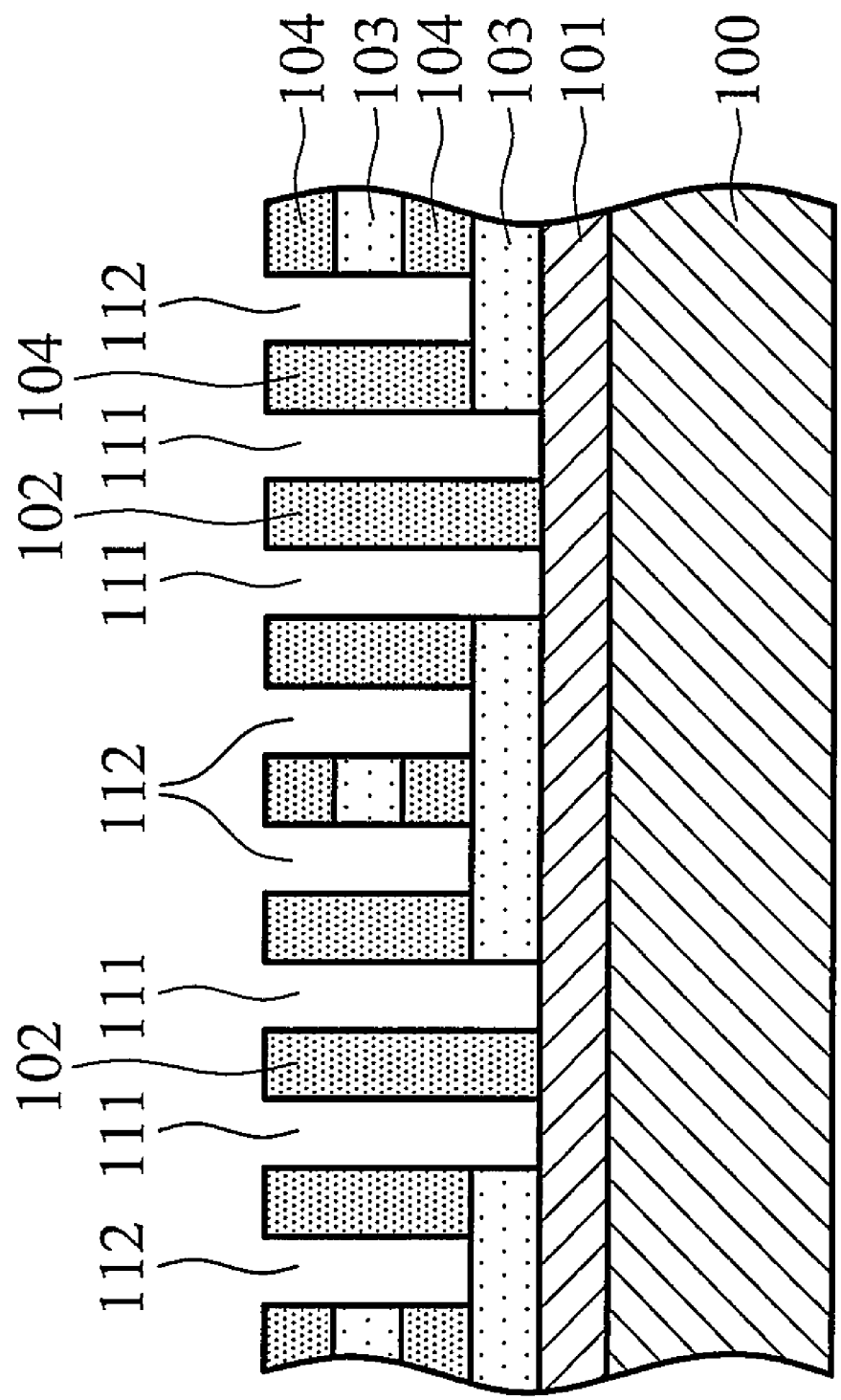

Referring to FIG. 5, a second etching step is then performed to anisotropically etch the second layer 104. The second etch step is selective to the mask layer 101, and the first layer 103, thus the second layer 104 is selectively and anisotropically etched without attacking the first layer 103 and the seed features 102. After the second layer 104 is etched, the second layer 104 in the second openings 112 is removed. The portion of the second layer 104 standing between openings 111 and 112 will have a reduced height after the second etching step. In case that the second layer 104 and the seed features 102 are of the same material, the heights of the seed features 102 will be also reduced during this second etch step.

Figure 6:
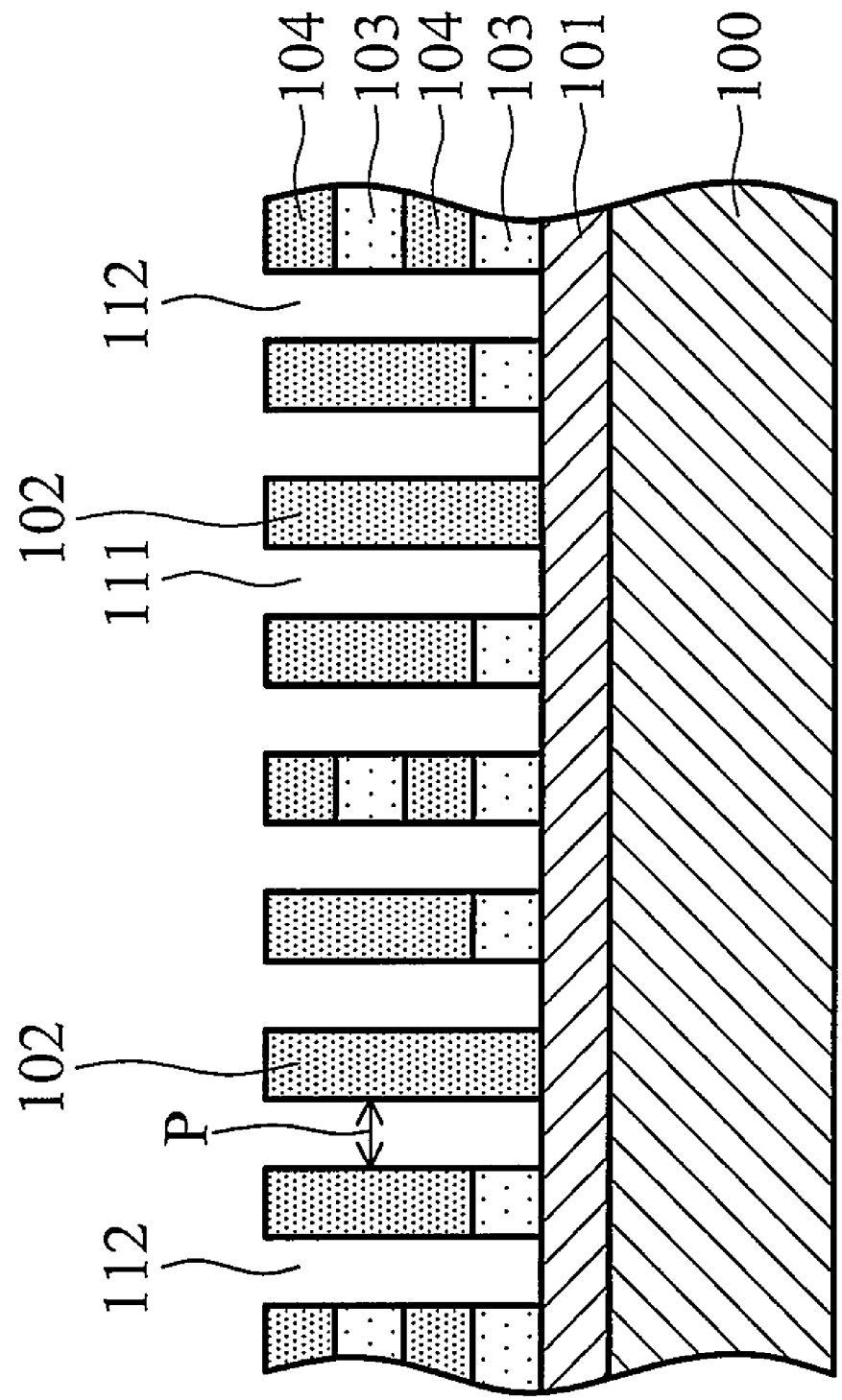
Figure 7:
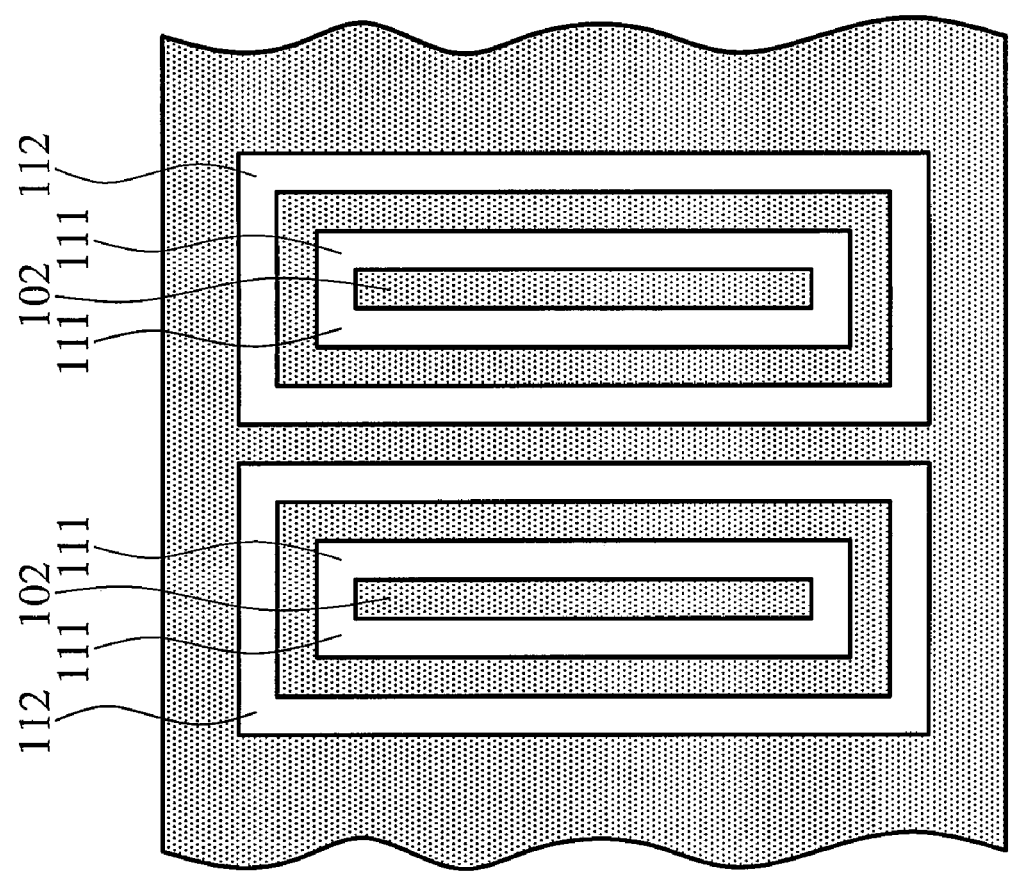

Referring to FIG. 6, a third etching step similar to the first etching step is performed to anisotropically etch the first layer 103 again. After the third etching step, the first layer 103 in the second openings 112 is removed, and thus the second openings 112 expose the underlying mask layer 101. In one embodiment, the first, second and third etching steps may take place in one chamber. After performing the third etching step, a plurality of openings, exposing the mask layer 101, and including the first opening 111 and the second opening 112, are formed between the seed features 102 and on each side of the seed features 102. If each deposited layer thickness is substantially the same, a new pattern having half-pitch of "P" between each line is formed above the mask layer 101. It is noted the final half-pitch of "P" is equal to (S+W)/2N, wherein N is the total number of deposited layers (counting one first layer 103 and one second layer 104 as two layers and excluding the blanket layer). In this embodiment, the seed feature spacing+width S+W is about 200 nm, and the total number "N" of layers deposited is 4, thus the final half-pitch "P" is about 25 nm. It should be noted S+W is the original pitch, while (S+W)/N is the final feature pitch. Hence feature density can be indefinitely increased by increasing N. FIG. 7 shows a top view of the new pattern according to FIG. 6. An onion-like loop is seen from the top view.

Figure 8:
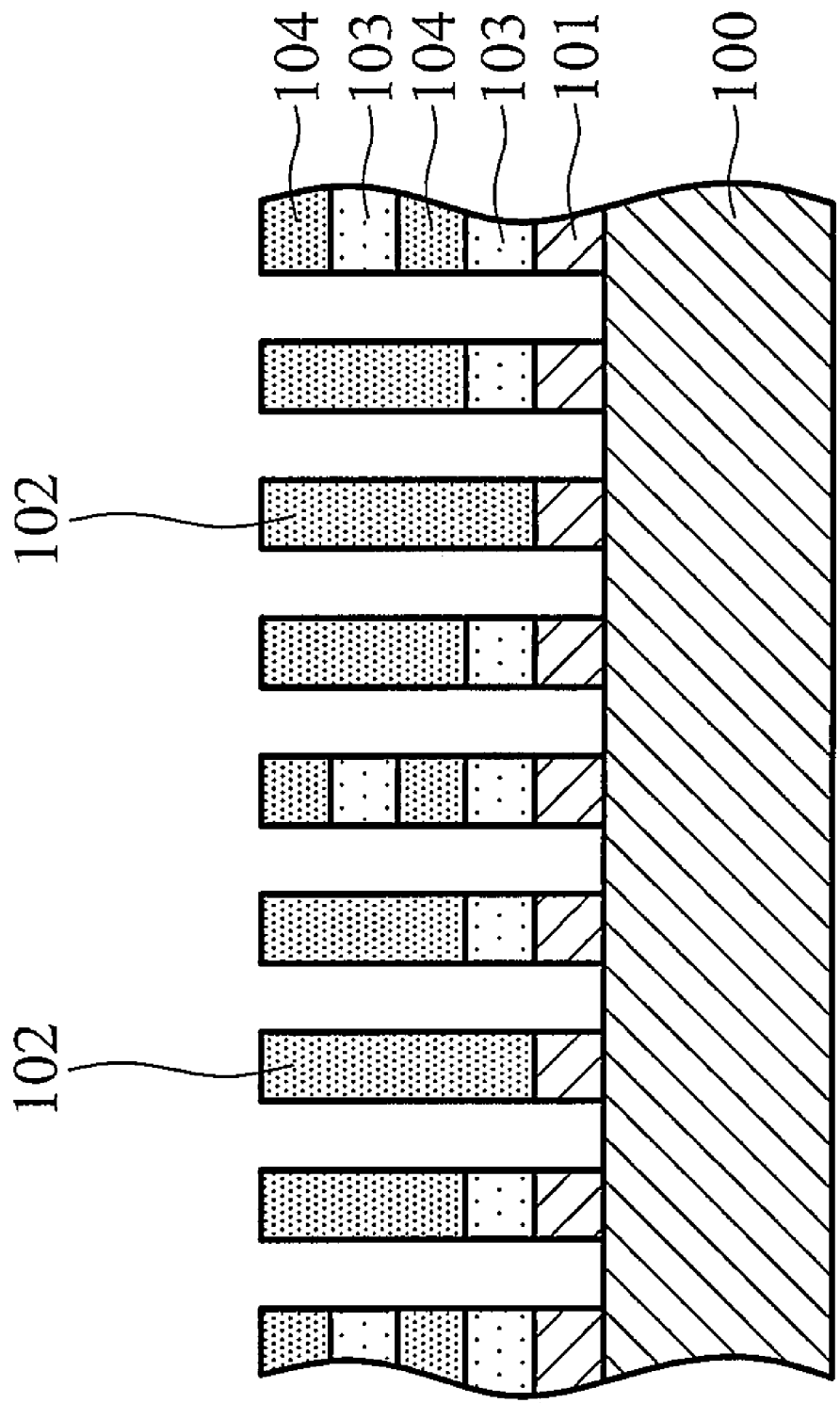

Next referring to FIG. 8, the new pattern may be transferred into the underlying mask layer 101 by using the new pattern as a mask and performing another etching step.

Figure 9:
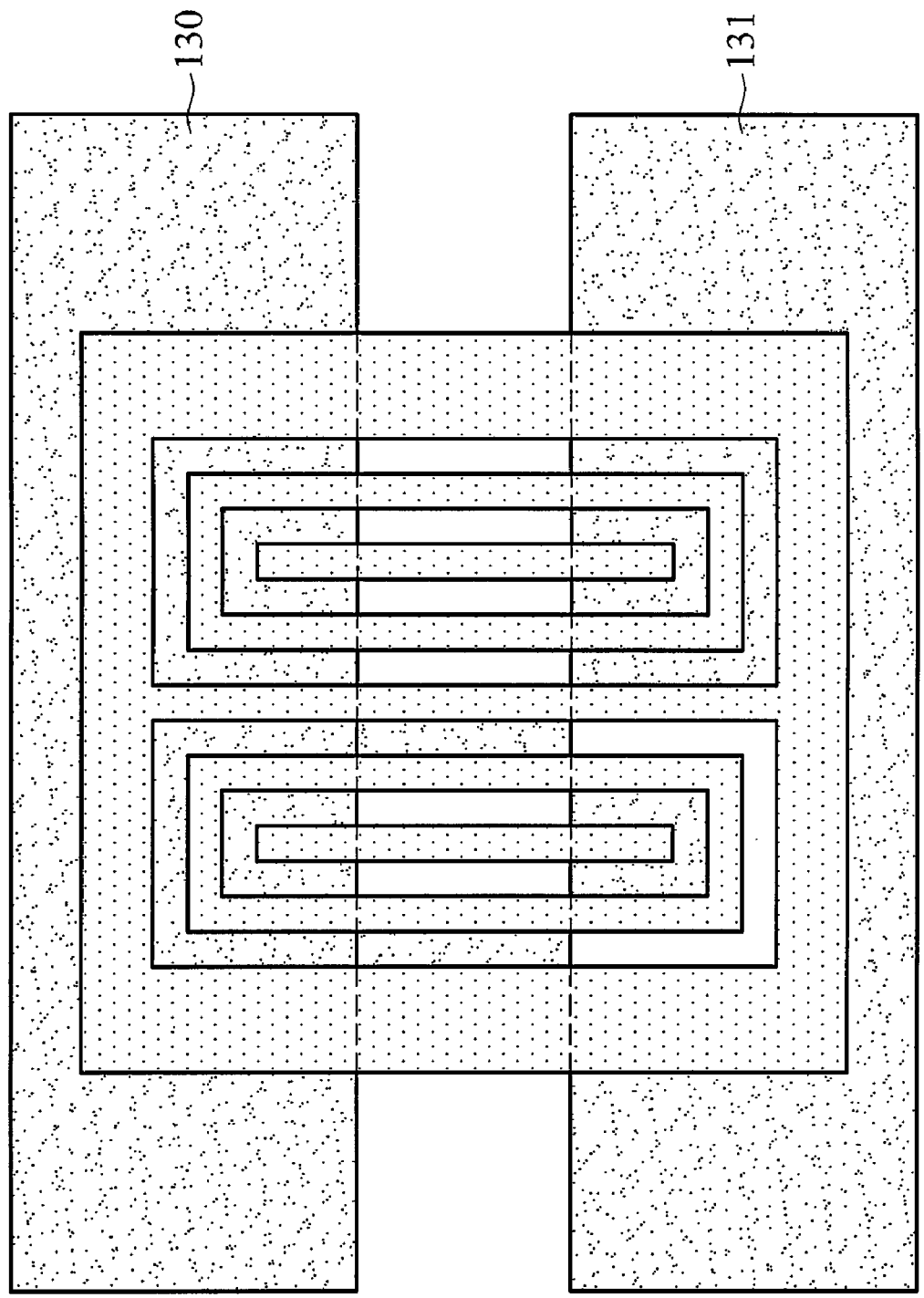
FIGS. 9 to 10 are schematic views showing applications of the patterns formed by an embodiment of the invention.
Figure 10:
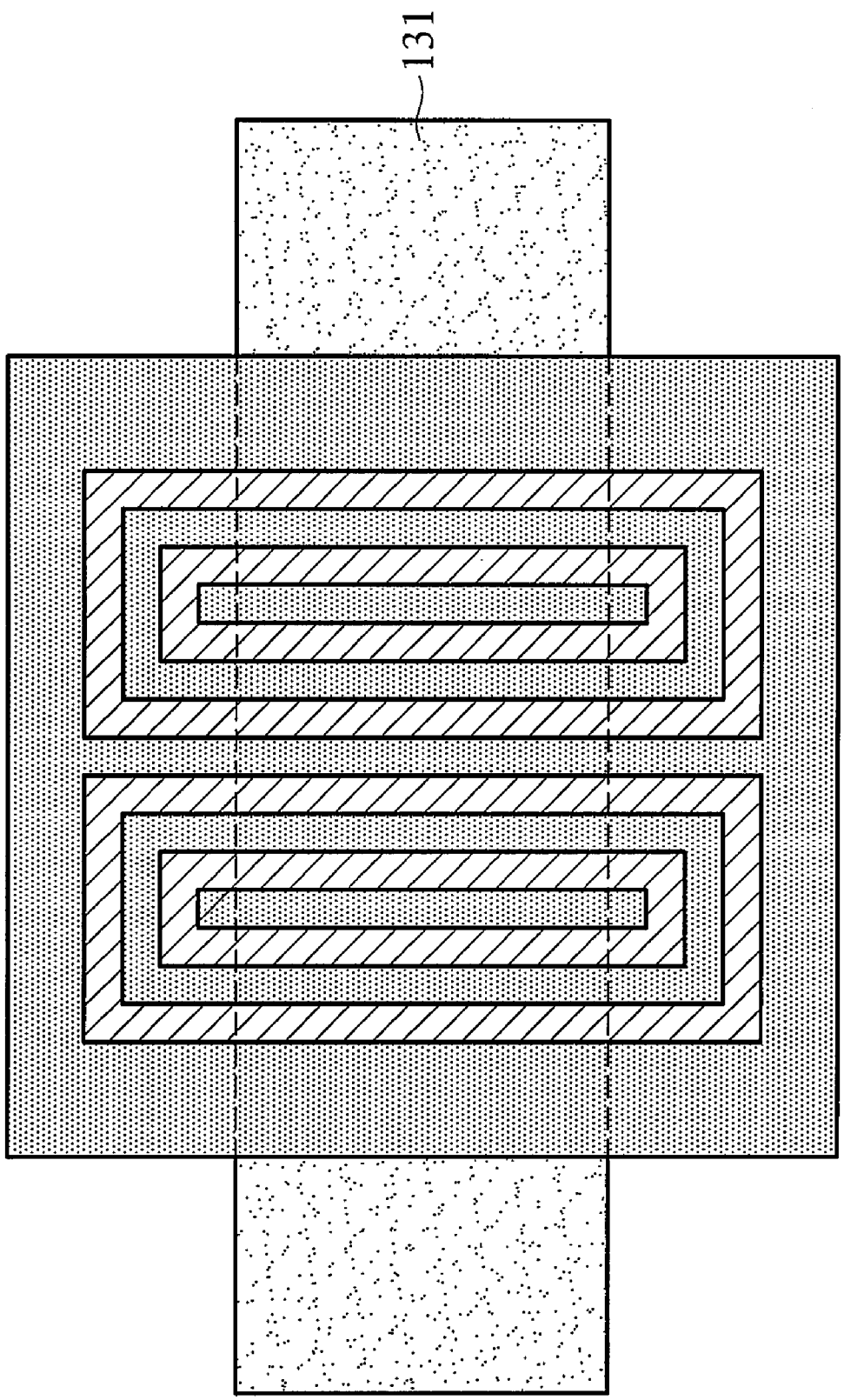

In another embodiment, the onion-like loop may be broken before the new pattern is transferred into the underlying mask layer, most simply by using a photoresist to mask off the areas that are not desired to be transferred down to the underlying mask layer. For example, a photoresist layer 130 may be used to mask the onion-like loop ends as FIG. 9 shows, so that only a middle portion of the onion-like loop is transferred down to the underlying mask layer. Alternatively, a photoresist layer 131 may be used to mask a middle portion of the onion-like loop as FIG. 10 shows, so that only the onion-like loop ends are etched or transferred down to the underlying mask layer.

Referring back to FIG. 1, The height "H" of seed feature 102 is chosen so as to determine the number of arrayed lines on each side of the seed feature in the onion-like loop. For example, if we choose to create a maximum number of 4 arrayed lines on each side of the seed feature, the seed feature height "H" may not be less than 4 bi-layer thicknesses. If height H exceeds 4 bi-layer thicknesses, 4 or more arrayed line features can be patterned on each side of the seed feature.

Even though the embodiment described above have one common thickness for each layer 103 and another common thickness for each layer 104, it is not necessary. As can be seen and figured out in FIG. 4, the width of each first opening 111 is defined by the thickness of the layer 103 in the bottom-most bi-layer L1, while the width of each second opening 112 is defined by the thickness of the layer 103 in the second bi-layer L2. In case that the first layer 103 of the bi-layer L1 has a thickness different from that of the bi-layer L2, the first opening 111 will differ from the second opening 112 in width. Similarly, in case that the thickness of the second layer 104 in the bi-layer L1 is different from that of the second layer 104 in the bi-layer L2, the distance between two adjacent openings may vary, depending on which second layer 104 stands between.

FIGS. 11 to 17 are schematic views showing a method for forming patterns according to another embodiment of the invention. Elements in this embodiment similar to or the same as elements in the above embodiment are labeled as similar or the same symbols and further description of these elements are omitted for simplicity.

Figure 11:
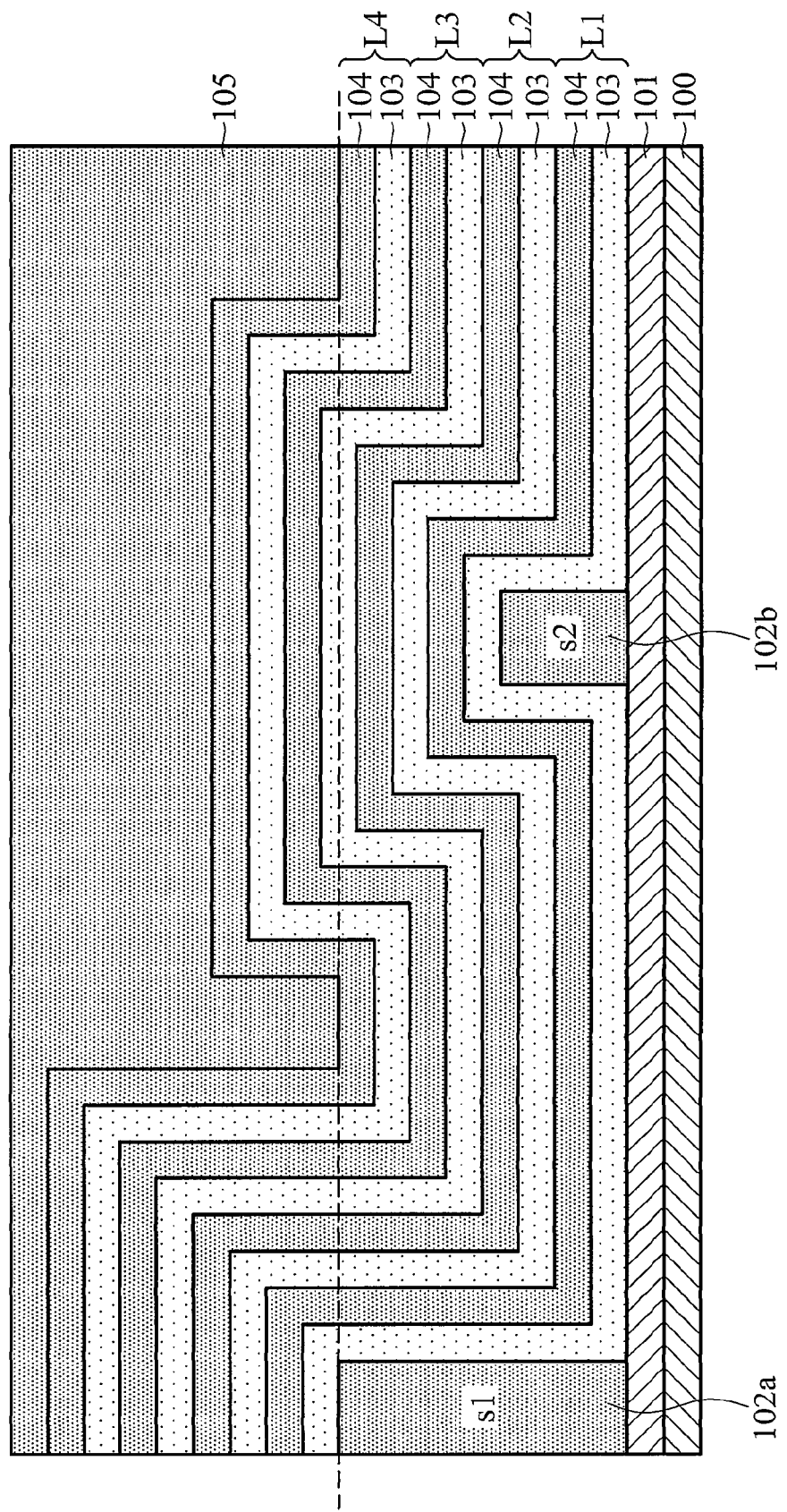
FIGS. 11 to 17 are schematic views showing a method for forming patterns according to another embodiment of the invention.

Referring to FIG. 11, a substrate 100 having a mask layer 101 formed thereon is first provided. A set of seed features 102a and 102b is then formed on the mask layer 101, wherein the seed features 102a and 102b have different heights. For example, the seed feature 102a is higher than the seed feature 102b. Next, 4 bi-layers L1, L2, L3 and L4 may be formed on the seed features 102a and 102b. Each bi-layer may comprise a first layer 103 followed by a second layer 104. Each first layer 103 and second layer 104 is conformally deposited. A blanket film 105 may be formed on the last bi-layer to create a flat top surface on the resulting structure. For example, the seed features 102a and 102b may be silicon nitride; the first layer 103 may be silicon oxide; the second layer 104 may be silicon nitride; and the blanket film 105 may be silicon nitride.

Figure 12:
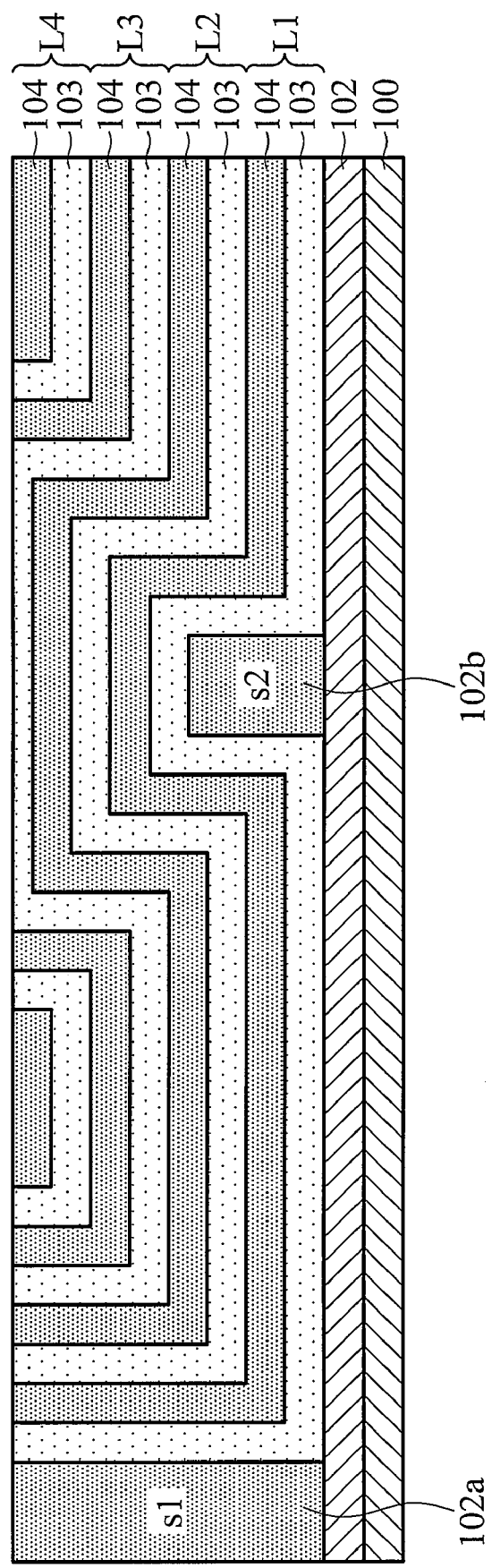

Referring to FIG. 12, a planarization step is performed to remove the first layer 103, the second layer 104 and the blanket film 105 above the seed feature 102a to reveal top surface of the seed feature 102a. The planarization step may be chemical-mechanical planarization (CMP) and/or etch-back. In one embodiment, the planarization step removes the first layer 103, the second layer 104 and the blanket film 105 at equal rates.

Figure 13:
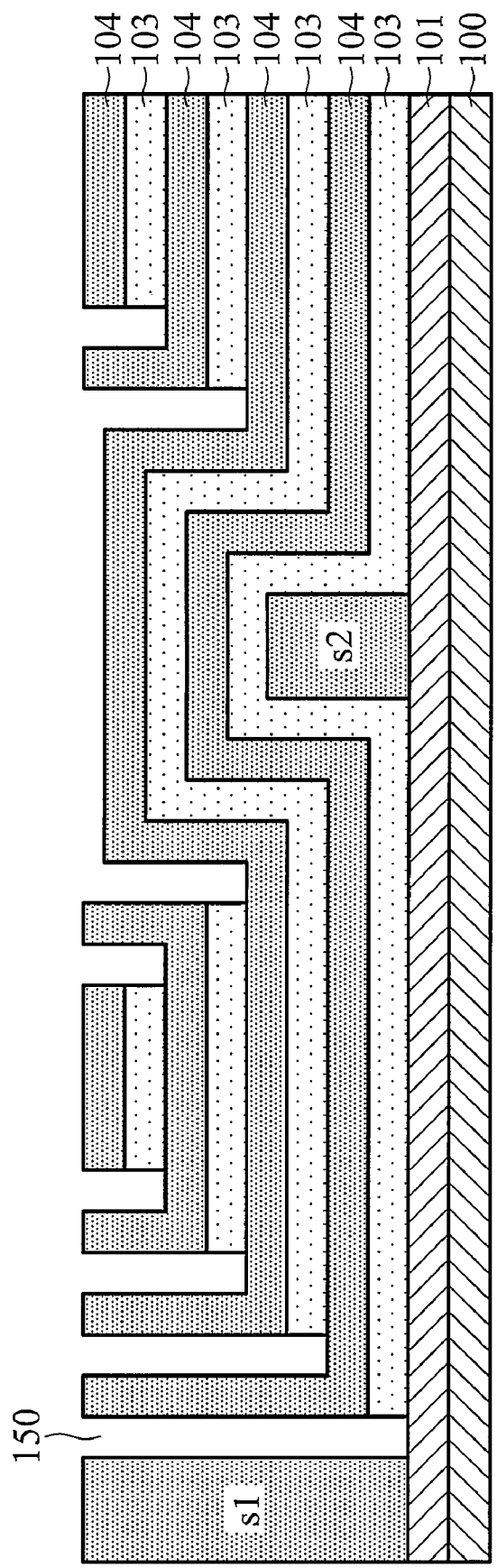
Figure 14:
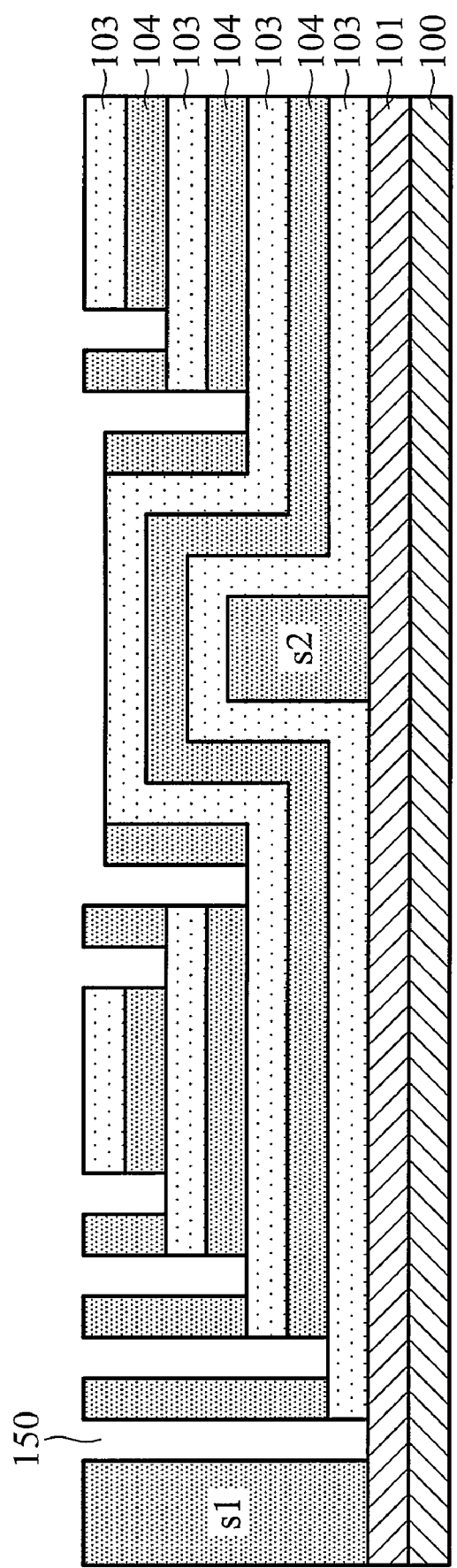

Referring to FIG. 13, the first layer 103 is anisotropically etched to form an opening 150, locating beside seed features 102a and exposing the underlying mask layer 101. Referring to FIG. 14, the second layer 104 is then anisotropically etched, removing exposed material 104.

Figure 15:
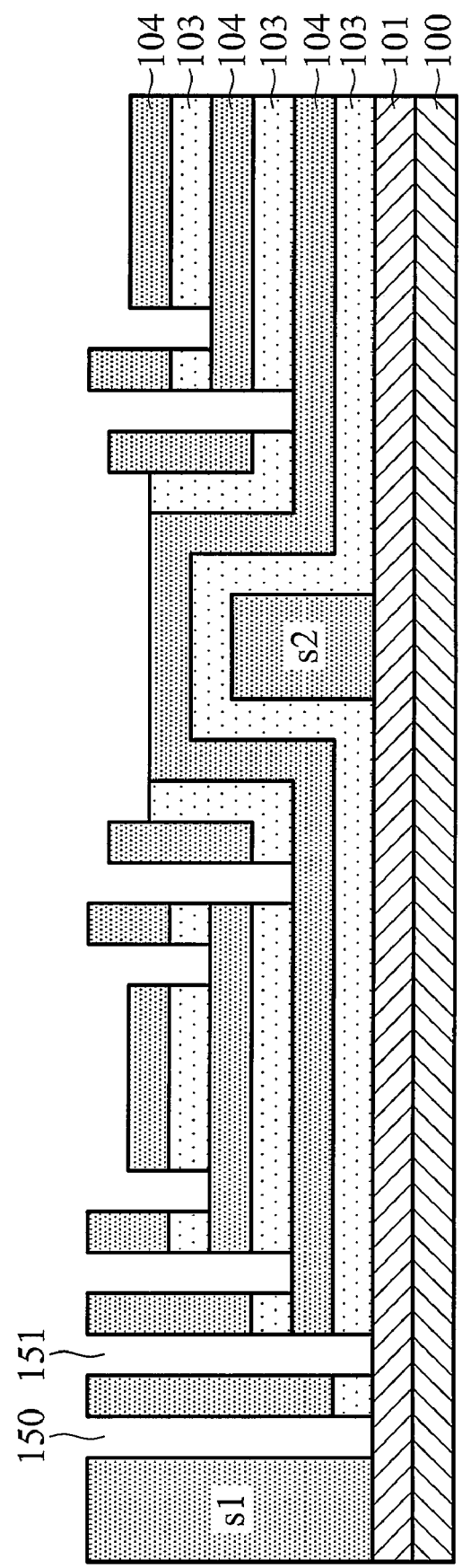
Figure 16:
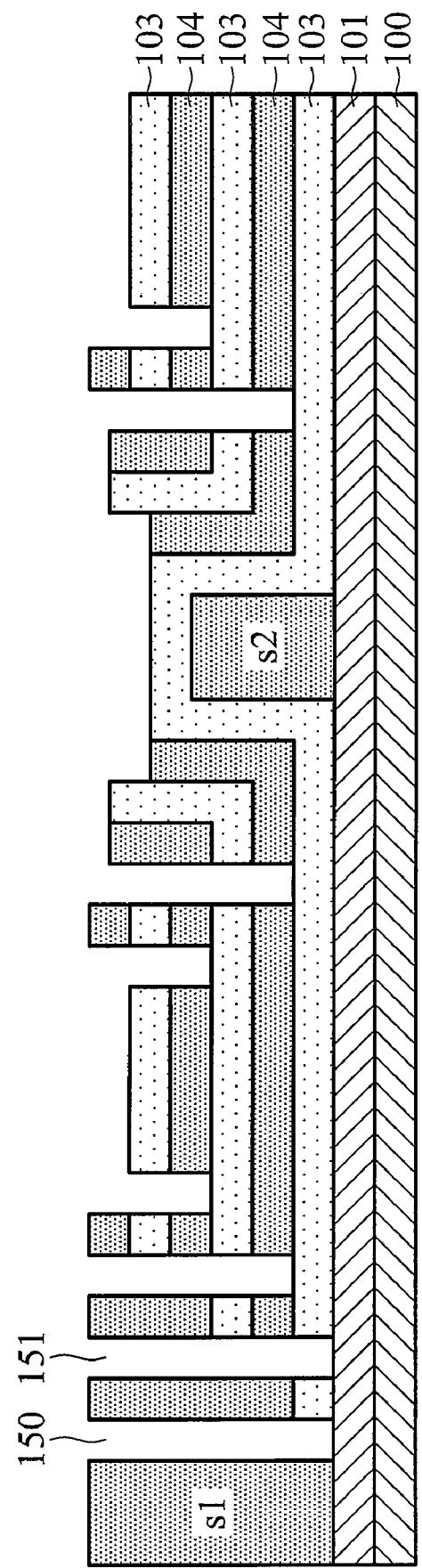

Referring to FIG. 15, the first layer 103 is anisotropically etched again, thereby forming an opening 151 exposing the underlying mask layer 101. Referring to FIG. 16, the second layer 104 is then anisotropically etched again.

Figure 17:
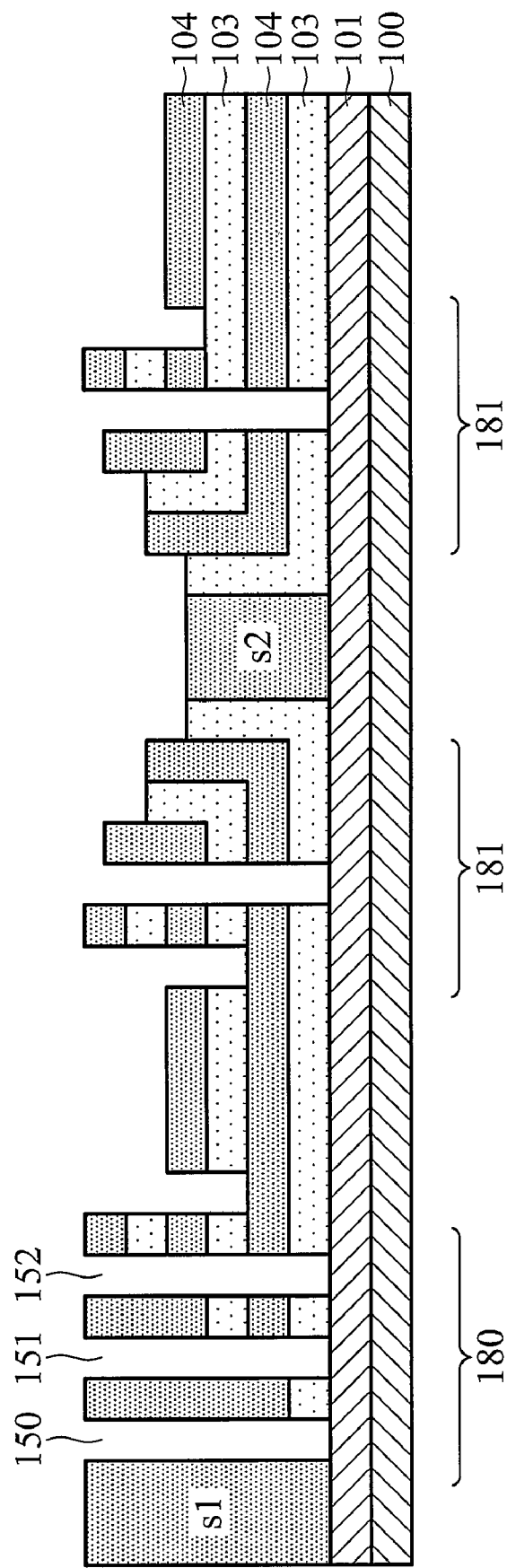

Referring to FIG. 17, the first layer 103 is anisotropically etched again to form openings 152 exposing the underlying mask layer 101. A new pattern is thus formed on the mask layer 101. It is noted that, by using seed features 102a and 102b having different heights, the new pattern having a dense trench region 180 and isolated trench regions 181 is created. The new pattern may next be transferred into the mask layer by a following etching step.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming patterns, comprising
providing a substrate;
forming a set of features over the substrate;
forming at least one bi-layer comprising a first layer followed by a second layer on the set of features, wherein the first layer and the second layer are made of different materials, and wherein the at least one bi-layer conformably covers the set of features and the substrate;
after forming the at least one bi-layer, removing the first layer and the second layer above the set of features; and
successively and anisotropically etching the first layer and the second layer at least one time to form an opening next to the set of features.

2. The method for forming patterns as claimed in claim 1, wherein the first layer and the second layer above the set of features are removed to reveal at least one of the features.

3. The method for forming patterns as claimed in claim 1, wherein the first layer comprises silicon dioxide, silicon nitride, silicon oxynitride or amorphous silicon.

4. The method for forming patterns as claimed in claim 1, wherein the second layer comprises silicon dioxide, silicon nitride, silicon oxynitride or amorphous silicon.

5. The method for forming patterns as claimed in claim 1, wherein the set of features comprise nitride.

6. The method for forming patterns as claimed in claim 1, further comprising forming a mask layer between the substrate and the set of features.

7. The method for forming patterns as claimed in claim 6, wherein the mask layer comprises dielectric material.

8. The method for forming patterns as claimed in claim 1, further comprising forming a blanket film on the upper-most bi-layer.

9. The method for forming patterns as claimed in claim 8, wherein the blanket film is made of the same material as either the first or second layer.

10. The method for forming patterns as claimed in claim 1, wherein the first layer is formed by plasma-enhanced chemical vapor deposition (PECVD), atomic-layer deposition (ALD) or thermal oxidation.

11. The method for forming patterns as claimed in claim 1, wherein the second layer is formed by plasma-enhanced chemical vapor deposition (PECVD), atomic-layer deposition (ALD) or thermal oxidation.

12. The method for forming patterns as claimed in claim 1, wherein the step of forming the at least one bi-layer takes place in one chamber.

13. The method for forming patterns as claimed in claim 1, wherein the step of successively anisotropically etching the first layer and the second layer at least one time takes place in one chamber.

14. The method for forming patterns as claimed in claim 1, wherein the first layer and the second layer above the set of features are removed by chemical-mechanical planarization (CMP) or etch-back.

15. The method for forming patterns as claimed in claim 1, wherein a pattern pitch between two adjacent features equals (S+W)/N, wherein "S" is the spacing between the two adjacent features, W is a feature width, and N is the total number of layers used for patterning.

16. The method for forming patterns as claimed in claim 1, where at least two features are of different heights.

* * * * *